(12) United States Patent
Fan

(10) Patent No.: US 10,693,423 B2
(45) Date of Patent: Jun. 23, 2020

(54) DYNAMIC AMPLIFICATION CIRCUIT

(71) Applicant: SHENZHEN GOODIX TECHNOLOGY CO., LTD., Shenzhen (CN)

(72) Inventor: Shuo Fan, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 124 days.

(21) Appl. No.: 16/147,857

(22) Filed: Sep. 30, 2018

(65) Prior Publication Data

US 2019/0068130 A1 Feb. 28, 2019

Related U.S. Application Data

(63) Continuation of application No. PCT/CN2017/099594, filed on Aug. 30, 2017.

(51) Int. Cl.
*H03F 1/30* (2006.01)
*H03F 3/04* (2006.01)
(Continued)

(52) U.S. Cl.
CPC .............. *H03F 1/30* (2013.01); *H03F 1/0205* (2013.01); *H03F 1/301* (2013.01); *H03F 3/04* (2013.01);
(Continued)

(58) Field of Classification Search
USPC ............................................ 330/252–261, 11
See application file for complete search history.

(56) References Cited

U.S. PATENT DOCUMENTS 6,988,409 B2 1/2006 Furuichi
8,633,764 B2 * 1/2014 Agrawal ................. H03F 3/211
327/336

(Continued)

FOREIGN PATENT DOCUMENTS

CN 101364119 A 2/2009
CN 101471636 A 7/2009
(Continued)

OTHER PUBLICATIONS

Huang Hai et al: "A 12b 330MS/s Pipelined-SAR ADC with PVT-stabilized Dynamic Amplifier Achieving <1dB SNDR Variation", 2017 IEEE International Solid-State Circuits Conference (ISSCC) , IEEE, Feb. 5, 2017 (Feb. 5, 2017) , pp. 472-473, XP033073631, DOI: 10.1109/ISSCC.2017.7870466 [retrieved on Mar. 2, 2017] * col. 1, last paragraph; figure 28.4.2 *.

*Primary Examiner* — Hieu P Nguyen

(57) ABSTRACT

A dynamic amplification circuit includes a first drive circuit (310) generates a first driving voltage according to a first control signal and a first driving current; a second drive circuit (320) generates a first driving signal according to the first and a second driving voltage; a third drive circuit (330) generates a second control signal according to the first control signal and the first driving signal; and a dynamic amplifier DA (340) includes a first branch (101) including a first capacitor and a second branch (102) including a second capacitor which are connected by a first resistor (150) and a second resistor (160), an operation state of the DA (340) is controlled through the first and second control signals, a duration of the DA (340) in an amplification phase is proportional to a product of a resistance value of the first resistor and a capacitance value of the first capacitor.

17 Claims, 5 Drawing Sheets

(51) Int. Cl.
  *H03F 1/02* (2006.01)
  *H03F 3/00* (2006.01)
  *H03F 3/45* (2006.01)
(52) U.S. Cl.
  CPC ..... *H03F 3/45085* (2013.01); *H03F 3/45295* (2013.01); *H03F 2200/129* (2013.01); *H03F 2200/447* (2013.01); *H03F 2203/45376* (2013.01); *H03F 2203/45396* (2013.01)

(56) References Cited

U.S. PATENT DOCUMENTS

2012/0313703 A1  12/2012  Agrawal et al.
2013/0215954 A1   8/2013  Beukema et al.

FOREIGN PATENT DOCUMENTS

| CN | 101515798 A | 8/2009 |
| CN | 205646432 U | 10/2016 |

\* cited by examiner

DYNAMIC AMPLIFICATION CIRCUIT

CROSS REFERENCE TO RELATED APPLICATIONS

The present application is a continuation of international application No. PCT/CN2017/099594, filed on Aug. 30, 2017, which is hereby incorporated by reference in its entirety.

TECHNICAL FIELD

Embodiments of the present application relate to the field of circuits, and in particular, to a dynamic amplification circuit.

BACKGROUND

A dynamic amplifier (DA) has advantages of low power consumption and no overshoot in comparison with a conventional operational amplifier with feedback circuit.

However, gain of the dynamic amplifier will vary with, for example, a semiconductor process, a supply voltage and a temperature (Process, Voltage, Temperature, PVT), which limits its application to some extent.

Therefore, a dynamic amplification circuit is required, which is capable of providing relatively stable gain.

SUMMARY

The present application provides a dynamic amplification circuit, which could provide relatively stable gain.

According to a first aspect, a dynamic amplification circuit is provided, including:

a first drive circuit, configured to generate a first driving voltage according to a first control signal and a first driving current, where the first driving current is generated by a first reference voltage, and the first reference voltage is a constant voltage;

a second drive circuit, configured to generate a first driving signal according to the first driving voltage and a second driving voltage, where the first driving voltage varies with time, and the second driving voltage is a multiple of the first reference voltage;

a third drive circuit, configured to generate a second control signal according to the first control signal and the first driving signal; and a dynamic amplifier DA including a first branch and a second branch, where the first branch includes a first capacitor, the second branch includes a second capacitor, the first capacitor and the second capacitor are identical capacitors, the first branch and the second branch are connected by a first resistor and a second resistor, and the first resistor and the second resistor are identical resistors;

wherein the DA is configured to receive the first control signal and the second control signal, and an operation state of the DA is controlled through the first control signal and the second control signal, where a duration of the DA in an amplification phase is proportional to a product of a resistance value of the first resistor and a capacitance value of the first capacitor.

Therefore, a dynamic amplification circuit of an embodiment of the present application controls a voltage value of a first driving voltage through a first control signal, and then according to the first driving voltage and the second driving voltage, controls a duration of the DA in an amplification phase is proportional to a product of a resistance value of the resistor in the DA and a capacitance value of the capacitor in the DA, so that the dynamic amplification circuit could still provide relatively stable gain when PVT changes.

With reference to the first aspect, in a possible implementation manner of the first aspect, the first branch includes a first control switch, a second control switch and a first transistor.

The DA is specifically configured to:

receive the first control signal and the second control signal, and control turnon and turnoff of the first control switch and the second control switch through the first control signal and the second control signal, respectively.

With reference to the first aspect, in a possible implementation manner of the first aspect, an operation state of the first control signal is used to:

in a first time period, the first control signal outputs a high level;

in a second time period after the first time period, the first control signal outputs a low level, and a duration of the second time period is the duration of the DA in an amplification phase; and in a third time period after the second time period, the first control signal outputs a low level.

With reference to the first aspect, in a possible implementation manner of the first aspect, the first drive circuit is specifically configured to:

in a first time period, control the first driving voltage output to be zero;

in a second time period, control the first driving voltage output increase, but to be smaller than the second driving voltage; and in a third time period, control the first driving voltage output to be greater than or equal to the second driving voltage.

That is, a duration during which the first driving voltage is increased from zero to the second driving voltage is a duration of the DA in an amplification phase.

With reference to the first aspect, in a possible implementation manner of the first aspect, the first drive circuit includes a first current source and a third capacitor.

The first current source is configured to: charge the third capacitor in the second time period and the third time period, where a voltage drop of the third capacitor is the first driving voltage, a current value of the first current source is equal to the first driving current, and the first driving current is generated by applying the first reference voltage on a third resistor.

With reference to the first aspect, in a possible implementation manner of the first aspect, an amplification coefficient of the dynamic amplification circuit is proportional to $R_3 * C_3 / (R_1 * C_1)$, where $R_3$ is a resistance value of the third resistor, $C_3$ is a capacitance value of the third capacitor, $R_1$ is a resistance value of the first resistor, and $C_1$ is a capacitance value of the first capacitor.

With reference to the first aspect, in a possible implementation manner of the first aspect, the first resistor, the second resistor, and the third resistor are resistors of a same type, and the first capacitor, the second capacitor and the third capacitor are capacitors of a same type.

With reference to the first aspect, in a possible implementation manner of the first aspect, the second drive circuit is specifically configured to:

in a second time period, control the first driving signal output to be a low level; and in a third time period, control the first driving signal output to be a high level.

With reference to the first aspect, in a possible implementation manner of the first aspect, the second drive circuit includes a fourth capacitor, a first inverter and a second inverter.

One end of the fourth capacitor receives the first driving voltage via a first switch device and receives the second driving voltage via a second switch device, and the other end of the fourth capacitor is connected to an input end of the first inverter.

The input end and an output end of the first inverter are connected via a third switch device, the output end of the first inverter is connected to an input end of the second inverter, and an output end of the second inverter is configured to output the first driving signal.

With reference to the first aspect, in a possible implementation manner of the first aspect, the first control signal is further used to:

control turnon and turnoff of the first switch device, the second switch device and the third switch device.

The first control signal is used to:

control, in the first time period, the first switch device to be turned off and the second switch device and the third switch device to be turned on, and control, in the second time period and the third time period, the first switch device to be turned on and the second switch device and the third switch device to be turned off.

With reference to the first aspect, in a possible implementation manner of the first aspect, the second drive circuit is a continuous time comparator, a first input end of the continuous time comparator is used to receive the first driving voltage, a second input end of the continuous time comparator is used to receive the second driving voltage, and an output end of the continuous time comparator is used to output the first driving signal.

With reference to the first aspect, in a possible implementation manner of the first aspect, the third drive circuit is specifically configured to:

in a first time period, control the second control signal output to be a low level;

in a second time period, control the second control signal output to be a high level; and in a third time period, control the second control signal output to be a low level.

With reference to the first aspect, in a possible implementation manner of the first aspect, the third drive circuit includes a third inverter, a fourth inverter and an AND circuit.

An input end of the third inverter is used to receive the first control signal, and an output end of the third inverter is connected to a first input end of the AND circuit.

An input end of the fourth inverter is used to receive the first drive signal, and an output end of the fourth inverter is connected to a second input end of the AND circuit.

An output end of the AND circuit is used to output the second control signal.

With reference to the first aspect, in a possible implementation manner of the first aspect, the first reference voltage is a bandgap reference voltage.

With reference to the first aspect, in a possible implementation manner of the first aspect, the first control signal is specifically used to:

control, in the first time period, the first control switch to be turned on, and control, in the second time period and the third time period, the first control switch to be turned off The second control signal is used to:

control, in the first time period, the second control switch to be turned off, control, in the second time period, the second control switch to be turned on, and control, in the third time period, the second control switch to be turned off.

With reference to the first aspect, in a possible implementation manner of the first aspect, the first branch includes a first transistor, the second branch includes a second transistor, and a source of the first transistor and a source of the second transistor are connected via the first resistor and the second resistor.

With reference to the first aspect, in a possible implementation manner of the first aspect, a product of a transconductance of the first transistor in a saturation region and a resistance value of the first resistor is greater than a multiple threshold.

Therefore, a dynamic amplification circuit of an embodiment of the present application controls a voltage value of a first driving voltage through a first control signal, and then according to the first driving voltage and the second driving voltage, controls a duration of the DA in an amplification phase is proportional to a product of a resistance value of the resistor in the DA and a capacitance value of the capacitor in the DA, so that the dynamic amplification circuit could still provide relatively stable gain when PVT changes.

DESCRIPTION OF EMBODIMENTS

A technical solution of the present application is described below in combination with the accompanying drawings.

Figure 1:
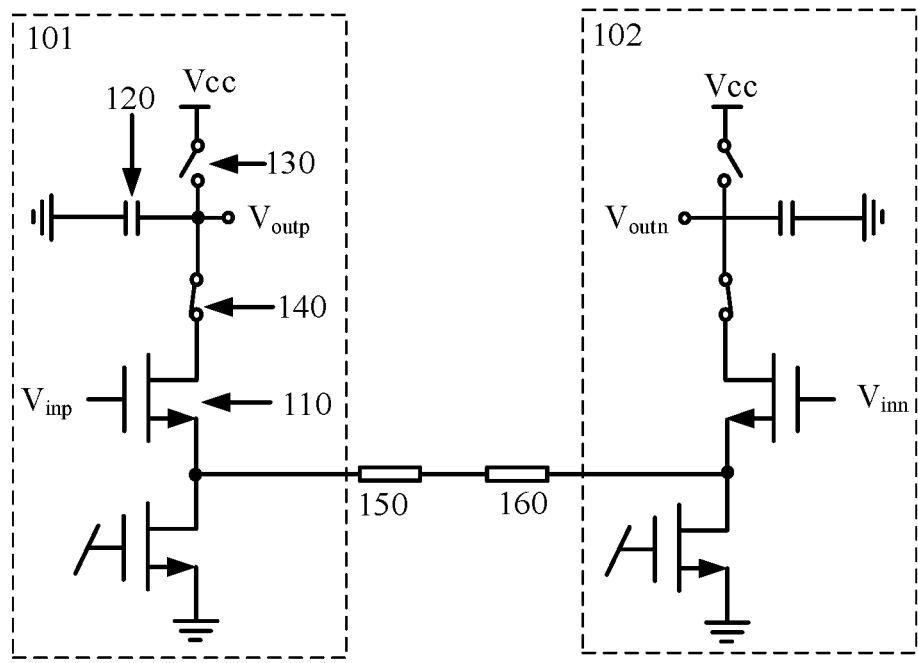
FIG. 1 is a schematic structural diagram of a dynamic amplifier according to an embodiment of the present disclosure.
Figure 2:
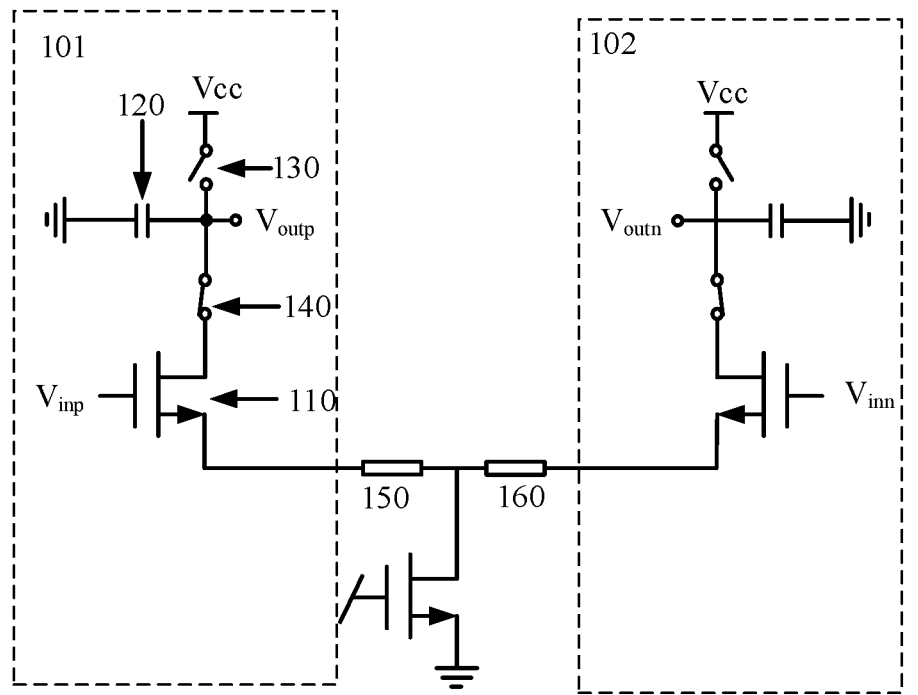
FIG. 2 is another schematic structural diagram of a dynamic amplifier according to an embodiment of the present disclosure.

FIG. 1 and FIG. 2 are schematic structural diagrams of a dynamic amplifier according to an embodiment of the present application. As shown in FIG. 1 and FIG. 2, the dynamic amplifier 100 includes a first branch 101 and a second branch 102, the first branch 101 and the second branch 102 are a symmetrical structure, and devices included in the first branch 101 and the second branch 102 and parameters of the devices are identical. The first branch 101 is mainly taken as an example herein, and an operating state of devices in the second branch 102 is the same as that of corresponding devices in the first branch 101, and thus detailed description thereof is not set forth herein for simplicity.

Specifically, the first branch 101 includes a first transistor 110, a first capacitor 120, a first control switch 130 and a second control switch 140.

It can be seen from FIG. 1 and FIG. 2 that the DA in the embodiment of the present application is different from the existing DA in that sources of two symmetric transistors are connected through two symmetric resistors (i.e., a first resistor 150 and a second resistor 160 shown in FIG. 1). Therefore, an amplification coefficient of the DA in the embodiment of the present application is slightly different from an amplification coefficient of the existing DA, and the amplification coefficient of the DA in the embodiment of the present application will be described in detail later.

It should be noted that a DA shown in FIG. 1 differs from a DA shown in FIG. 2 in that, in the DA shown in FIG. 1, there is a current across the first resistor 150 and the second resistor 160, so that there is a voltage drop across the first resistor 150 and the second resistor 160, while there is no voltage drop across the first resistor 150 and the second resistor 160 in the DA shown in FIG. 2, which results in that a range of an output voltage of the DA in FIG. 1 is narrower than a range of an output voltage of the DA in FIG. 2. However, this does not affect that the dynamic amplification circuit designed based on the DA shown in FIG. 1 and the DA shown in FIG. 2 provide stable gain, and the difference is that the gain of the dynamic amplification circuit based on the DA shown in FIG. 1 may be smaller than the gain of the dynamic amplification circuit based on the DA shown in FIG. 2.

An operation state of the DA in the embodiment of the present application includes two phases:

in a first phase, the first control switch 130 is turned on, the second control switch 140 is turned off, the first capacitor 120 is connected to an anode (Vcc) of a power supply, and the first capacitor 120 is in a charging state; and in a second phase, the first control switch 130 is turned off, the second control switch 140 is turned on, the first capacitor 120 is connected to a drain of the first transistor 110 via the second control switch 140, and the first capacitor 120 is in a discharging state.

Figure 3:
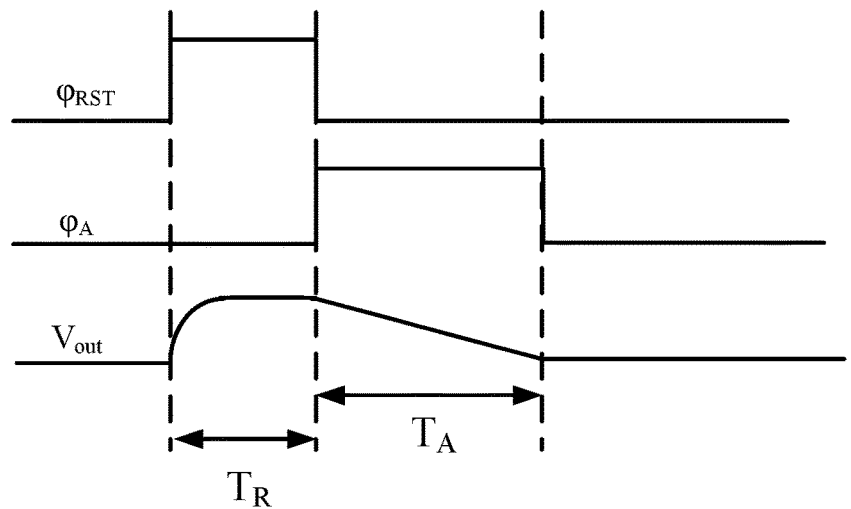
FIG. 3 is a logic timing diagram of a dynamic amplifier according to an embodiment of the present disclosure.

FIG. 3 is a logic timing diagram of the DA 100 in the embodiment of the present application, where $\varphi_{RST}$ is the timing of the first control switch 130, $\varphi_A$ is the timing of the second control switch 140, and $V_{out}$ is the timing of an output voltage.

As shown in FIG. 3, in a first phase (denoted as $T_R$), the first control switch 130 is turned on, the second control switch 140 is turned off, and the DA is in a reset state; and in a second phase (denoted as $T_A$), the first control switch 130 is turned off, the second control switch 140 is turned on, and the DA is in an amplification state, that is, a duration of the DA in the amplification state is the duration $T_A$ of the second phase.

Figure 4:
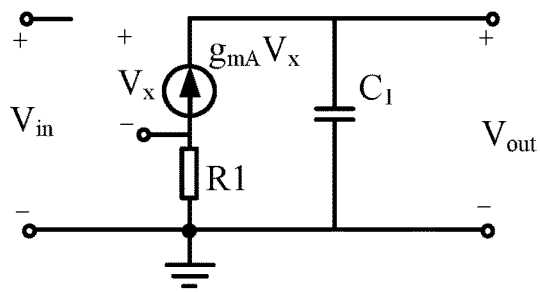
FIG. 4 is an equivalent circuit diagram of a dynamic amplifier according to an embodiment of the present disclosure.

FIG. 4 is an equivalent circuit diagram of the DA 100 shown in FIG. 1 or FIG. 2, where $g_{mA}$ is a transconductance of the first transistor 110 in a saturation region, $C_1$ is a capacitance value of the first capacitor 120, and $R_1$ is a resistance value of the first resistor 150.

It should be noted that, due to difference between $V_{inp}$ and $V_{inn}$, drain voltages of the transistors in the first branch and the second branch may be slightly different, which may cause changes in differential-mode gain of the dynamic amplifier. However, an influence caused by the difference between $V_{inp}$ and $V_{inn}$ is relatively small, which is ignored in calculating the amplification coefficient in the embodiment of the present application.

As can be seen from the equivalent circuit diagram shown in FIG. 4, an input voltage $V_{in}$ of the DA is as shown in formula (1):

$$V_{in}=V_X+g_{mA}*V_X*R_1 \qquad \text{formula (1)}$$

As can be seen from the formula (1), $V_x=V_{in}/(1+g_{mA}*R_1)$.

The output voltage $V_{out}$ of the DA may be determined according to formula (2):

$$V_{out}=g_{mA}*V_X*T_A/C_1 \qquad \text{formula (2)}$$

Formula (3) may be obtained by substituting $V_x=V_{in}/(1+g_{mA}*R_1)$ into the formula (2):

$$V_{out} = V_{outp} - V_{outn} = \frac{g_{mA}}{(1+g_{mA}*R_1)} * V_{in} * T_A/C_1 \qquad \text{formula (3)}$$

Therefore, the amplification coefficient (gain) Av of the DA is as shown in formula (4):

$$A_v = \frac{V_{out}}{V_{in}} = \frac{g_{mA}}{(1+g_{mA}*R_1)} * T_A/C_1 \qquad \text{formula (4)}$$

Optionally, in the embodiment of the present application, a product of the transconductance $g_{mA}$ of the first transistor in a saturation region and a resistance value $R_1$ of the first resistor is greater than a multiple threshold, for example, the multiple threshold may be 10 or 20 or the like. In this case, it may be considered that $g_{mA}*R_1 \gg 1$, and then $1+g_{mA}*R_1$ is approximately equal to $g_{mA}*R_1$, so that the formula (4) may be simplified to formula (5):

$$A_v = \frac{V_{out}}{V_{in}} = \frac{g_{mA}}{g_{mA}*R_1} * T_A/C_1 = \frac{T_A}{R_1*C_1} \qquad \text{formula (5)}$$

Those skilled in the art will appreciate that a gain of the existing DA is related to $g_{mA}$ and $C_1$, and since $g_{mA}$ and $C_1$ vary with PVT, the gain of the DA is unstable. The embodiment of the present application provides a dynamic amplification circuit, in which $T_A$ is designed to be proportional to $R_1*C_1$, so that the dynamic amplification circuit could still provide relatively stable gain when PVT changes.

Figure 5:
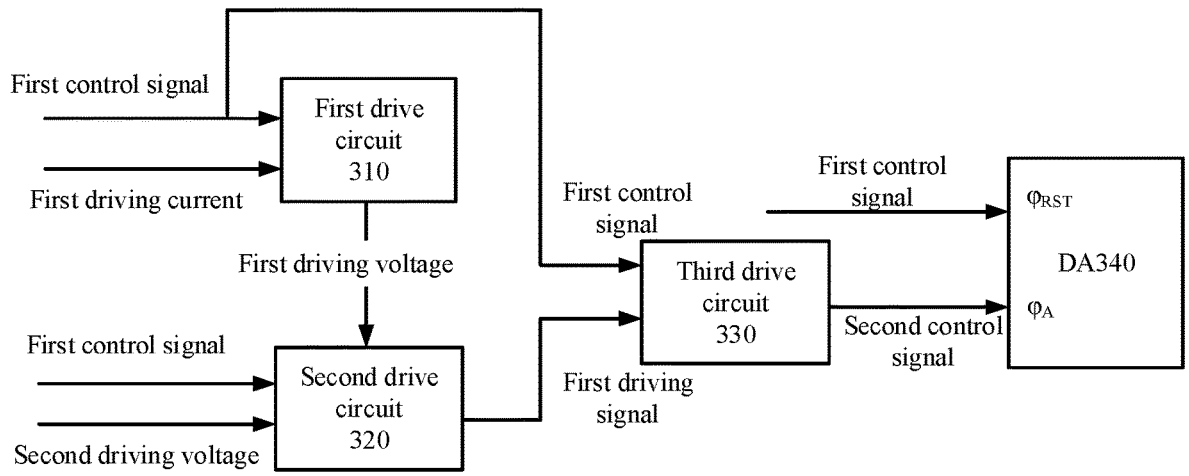
FIG. 5 is a schematic diagram of a dynamic amplification circuit according to an embodiment of the present disclosure.

FIG. 5 is a schematic structural diagram of a dynamic amplification circuit 300 provided by an embodiment of the present application. As shown in FIG. 5, the dynamic amplification circuit 300 includes:

a first drive circuit 310, configured to generate a first driving voltage according to a first control signal and a first driving current, where the first driving current is generated by a first reference voltage, and the first reference voltage is a constant voltage.

It should be noted that, in the embodiment of the present application, the first reference voltage is a constant voltage and does not vary with PVT. For example, the first reference voltage may be a bandgap reference voltage $V_{BG}$. Those skilled in the art will appreciate that the $V_{BG}$ may be generated by a bandgap reference circuit, and the first driving current may be generated by applying the first reference voltage on a resistor. Hereinafter, as an example, the first reference voltage is $V_{BG}$, but it should not constitute any limit to the embodiment of the present disclosure. The first reference voltage in the embodiment of the present application may also be another voltage that does not vary with PVT.

The first control signal herein may be used to control the first control switch 130 in the DA shown in FIG. 1 or FIG. 2, that is, the first control signal may correspond to the control signal $\varphi_{RST}$ in FIG. 3. Therefore, in a first time period (corresponding to the first phase described above), the first control signal may be a high level, and in a second time period (corresponding to the second phase described above), the first control signal may be a low level, and turnon and turnoff of the first control switch may be controlled through the first control signal.

The first drive circuit 310 may control changes of the first driving voltage according to the first control signal and the first driving current. For example, the first drive circuit 310 may control the first driving voltage to be zero in the first time period and to increase in the second time period.

Optionally, the first drive circuit 310 includes a first current source and a third capacitor, where the first current source is used to charge the third capacitor to obtain a first driving voltage in the second time period. A current value of the first current source is equal to the first driving current, and the first driving current may be generated by applying the first reference voltage on a third resistor.

In this case, an amplification coefficient of the dynamic amplification circuit may be proportional to $R_3 * C_3 / (R_1 * C_1)$, where $R_3$ is a resistance value of the third resistor, $C_3$ is a capacitance value of the third capacitor, $R_1$ is a resistance value of the first resistor, and $C_1$ is a capacitance value of the first capacitor.

That is to say, an amplification coefficient Av of a dynamic amplification circuit is as shown in the following formula:

$$A_v = K * \frac{C_3 * R_3}{C_1 * R_1}$$

Optionally, the first resistor, the second resistor, and the third resistor are resistors of a same type, and the first capacitor, the second capacitor and the third capacitor are capacitors of a same type.

Those skilled in the art will appreciate that in a complementary metal oxide semiconductor (CMOS) process, the same type of resistor or capacitor may be considered to be at a same process angle, and the first capacitor, the third capacitor, the first resistor and the third resistor are in a same environment (for example, a same temperature). Therefore, when PVT changes, the first capacitor and the third capacitor, and the first resistor and the third resistor have a same rate of change, respectively, so that a ratio of capacitance values of the first capacitor and the third capacitor may be considered to be a constant value, that is, $C_3/C_1$ does not vary with PVT. A ratio of resistance values of the first resistor and the third resistor is a constant value, that is, $R_3/R_1$ does not vary with PVT, and a coefficient K may be controlled by a designer, and does not vary with PVT, either. Therefore, the amplification coefficient of the dynamic amplification circuit of the embodiment of the present application is a constant gain that does not vary with PVT.

A second drive circuit 320 is configured to generate a first driving signal according to the first driving voltage and a second driving voltage, where the first driving voltage varies with time, and the second driving voltage is a multiple of the first reference voltage.

For example, the second driving voltage may be equal to $aV_{BG}$, where a may be equal to 1, or less than 1, or may be greater than 1, and the first driving voltage may initially be zero. At a certain time, the first driving voltage begins to increase, and the first driving voltage may be increased to be greater than or equal to the second driving voltage. The first driving voltage and the second driving voltage may be used to control a level value output by the first driving signal. For example, the second drive circuit may be configured to control the first driving signal output to be a low level when the first driving voltage is less than the second driving voltage, and control the first driving signal output to be a high level when the first driving voltage is greater than or equal to the second driving voltage. A duration of the first driving voltage increasing from zero to the second driving voltage may be considered as the foregoing TA. Therefore, by controlling a voltage difference between the first driving voltage and the second driving voltage, the TA may be controlled, and by controlling that the TA is proportional to a product of the resistance value of the first resistor and the capacitance value of the first capacitor, the dynamic amplification circuit can provide a stable gain.

A third drive circuit 330 is configured to generate a second control signal according to the first control signal and the first driving signal.

The second control signal herein may be used to control the second control switch 140 in the DA shown in FIG. 1 or FIG. 2, that is, the first control signal can correspond to the control signal $\varphi_A$ in FIG. 3. Therefore, in a first time period (corresponding to the first phase described above), the second control signal may be a low level, and in a second time period (corresponding to the second phase described above), the second control signal may be a high level, that is, turnon and turnoff of the second control switch may be controlled through the second control signal.

A dynamic amplifier DA 340 includes a first branch and a second branch, where the first branch includes a first capacitor, the second branch includes a second capacitor, the first capacitor and the second capacitor are identical capacitors, the first branch and the second branch are connected by a first resistor and a second resistor, and the first resistor and the second resistor are identical resistors.

Optionally, the DA 340 may be the DA 100 shown in FIG. 1 or FIG. 2, or may be another equivalent circuit. The first branch and the second branch may correspond to the first branch 101 and the second branch 102 in the DA 100 shown in FIG. 1 or FIG. 2, respectively, the first capacitor may correspond to the first capacitor 120 in the DA 100 shown in FIG. 1 or FIG. 2, and the first resistor and the second resistor may correspond to the first resistor 150 and the second resistor 160 in the DA 100 shown in FIG. 1 or FIG. 2, respectively. The first resistor and the second resistor are identical resistors, that is, the first resistor and the second resistor are of a same type and have a same resistance value. The first capacitor and the second capacitor are identical capacitors, that is, the first capacitor and the second capacitor are of a same type and have a same capacitance value.

The DA is configured to receive the first control signal and the second control signal, and an operation state of the DA is controlled through the first control signal and the second control signal, where a duration of the DA in an amplification phase is proportional to a product of a resistance value of the first resistor and a capacitance value of the first capacitor.

That is to say, the first control signal and the second control signal may be used as the control signals $φ_{RST}$ and $φ_A$ in FIG. 3 for controlling the first control switch 130 and the second control switch 140 of the DA 100, respectively. Through the first control signal and the second control signal, whether the DA is in a reset state (corresponding to the first phase described above) or in an amplification phase (corresponding to the second phase described above) may be controlled. Specifically, the first control signal is used to: in a first time period, control the first control switch to be turned on, in a second time period and a third time period, control the first control switch to be turned off; the second control signal is used to: in the first time period, control the second control switch to be turned off, in the second time period, control the second control switch to be turned on, and in the third time period, control the second control switch to be turned off.

Therefore, the dynamic amplification circuit of the embodiment of the present application controls a duration of the DA in the amplification phase to be proportional to a product of the resistance value of the first resistor and the capacitance value of the first capacitor through the first control signal and the second control signal, so that the gain of the dynamic amplification circuit does not vary with PVT.

A logic timing diagram of a dynamic amplification circuit according to an embodiment of the present disclosure is described in detail below in combination with FIG. 6.

In a first time period (corresponding to the first phase described above, or may also be referred to as a reset phase), that is, a time period between $t_1$ and $t_2$, the first control signal is at high level, the first driving voltage $V_1$ output by the first drive circuit is zero, the second driving voltage $V_2$ is a constant voltage value, and the second control signal output by the third drive circuit is at a low level.

It should be noted that, in the embodiment of the present application, in the first time period, a first driving signal output may be a low level, or may also be a high level. As an example, in FIG. 6, the first driving signal is at a low level, as long as the first control signal is at a high level and the second control signal is at a low level in the first time period.

In a second time period (corresponding to the second phase described above, or may also be referred to as an amplification phase) after the first time period, that is, a time period between $t_2$ and $t_3$, the first control signal is at a low level; in the second time period, the first driving voltage output by the first drive circuit starts to increase, but is still less than the second driving voltage. The first driving signal output by a second drive circuit according to the first driving voltage and the second driving voltage is still at a low level, and a second control signal output by a third drive circuit according to the first control signal and the first driving signal is at a high level.

In a third time period after the second time period, i.e., a time period after $t_3$, the first control signal is at a low level, the first driving voltage output by the first drive circuit is greater than or equal to the second driving voltage, the first driving signal output by the second drive circuit transforms from the low level to a high level, and the second control signal output by the third drive circuit transforms from the high level to a low level.

That is to say, the first drive circuit of the present application may output the first driving voltage $V_1$ according to the first control signal, where in the first time period, $V_1=0$; in the second time period, $V_1$ start to increase, but is still less than the second driving voltage $V_2$; and in the third time period, $V_1$ is increased to be greater than or equal to $V_2$, that is, a boundary between the second time period and the third time period is a time that $V_1$ is equal to $V_2$, i.e., $t_3$.

Optionally, in the third time period, $V_1$ may no longer increase after increasing to a value equal to $V_2$, or may continue to increase to a certain voltage value after being equal to $V_2$ and then no longer increase, or the like. The embodiment of the present application does not limit a voltage value of the first driving voltage in the third time period as long as the first driving signal is inverted at the time that $V_1$ is equal to $V_2$.

Further, the second drive circuit outputs the first driving signal according to the first driving voltage varying with time and the second driving voltage, that is, the second drive circuit outputs a low level when a first driving voltage is less than a second driving voltage; and the second drive circuit outputs a high level when the first driving voltage is greater than or equal to the second driving voltage.

For example, the second drive circuit may be implemented with a comparator, and in particular, the comparator may be a continuous time comparator.

Further, the third drive circuit outputs the second control signal according to the first control signal and the first driving signal, where the third drive circuit only needs to control the second control signal output to be a high level when the first control signal and the first driving signal are at a low level, and control the second control signal output to be a low level when the first control signal and the first driving signal are in another state.

For example, the third drive circuit may be implemented with a combination circuit of an inverter and an AND gate. For example, the first control signal and the first driving signal may be inverted, and then input to two input ends of the AND gate. In this case, the third drive circuit may control an output end of the AND gate to output a high level when the first control signal and the first driving signal are at a low level, and to output a low level when the first control signal and the first driving signal are in another state.

Therefore, a dynamic amplification circuit of an embodiment of the present application controls a first driving voltage output by a first drive circuit through a first control signal, and further according to the first driving voltage and a second driving voltage, controls a duration $T_A$ of a second time period to be proportional to a product of a capacitance value $C_1$ of a first capacitor and a resistance value $R_1$ of a first resistor in the DA, so that the dynamic amplification circuit can still provide a stable gain when PVT changes.

Implementation manners of a dynamic amplification circuit of embodiments of the present application are introduced in detail below in combination with specific examples shown in FIGS. 7 to 11.

It should be understood that examples shown in FIGS. 7 to 11 are for helping those skilled in the art better understand the embodiments of the present application, rather than for limiting the scope of the embodiments of the present application. Those skilled in the art may obviously perform, according to the provided FIGS. 7 to 11, various equivalent amendment or variations, which also fall in the scope of the embodiments of the present application.

Figure 7:
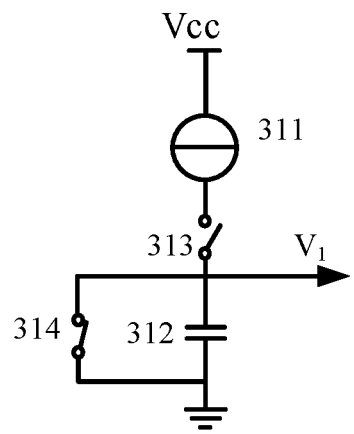
FIG. 7 is a schematic structural diagram of an example of a first drive circuit according to an embodiment of the present disclosure.

FIG. 7 is a schematic structural diagram of an example of a first drive circuit according to an embodiment of the present application. As shown in FIG. 7, a first drive circuit 310 includes a first current source 311, a third capacitor 312, a third control switch 313 and a fourth control switch 314, where the first current source 311 is connected to the third capacitor 312 via the third control switch 313, and the fourth control switch 314 is connected in parallel with the third capacitor 312. A current value of the first current source 311 is equal to the first driving current described above, and the first driving current is generated by applying the first reference voltage on a third resistor.

Optionally, if a first reference voltage is $V_{BG}$ and a resistance value of the third resistor is $R_3$, then the first driving current is $I_1=V_{BG}/R_3$.

In the embodiment, the first drive circuit 310 is specifically configured to:

receive a first control signal, control turnon and turnoff of the third control switch and the fourth control switch through the first control signal, and control the first current source to charge the third capacitor through the third control switch to generate a first driving voltage.

Optionally, in the embodiment, the first control signal is specifically used to:

control, in a first time period, the third control switch to be turned off and the fourth control switch to be turned on; and in second and third time periods, control the third control switch to be turned on, and the fourth control switch to be turned off.

Specifically, in the first time period, the third control switch is turned off, the fourth control switch is turned on, and a voltage drop across the third capacitor is zero, that is, the first driving voltage is zero. At a time $t_2$, the third control switch is turned on, the fourth control switch is turned off, and a first current source begins to charge the third capacitor, and therefore, in the second time period, the voltage drop across the third capacitor, i.e., the first driving voltage $V_1$ increases until it increases to be equal to a second driving voltage $V_2$.

Figure 6:
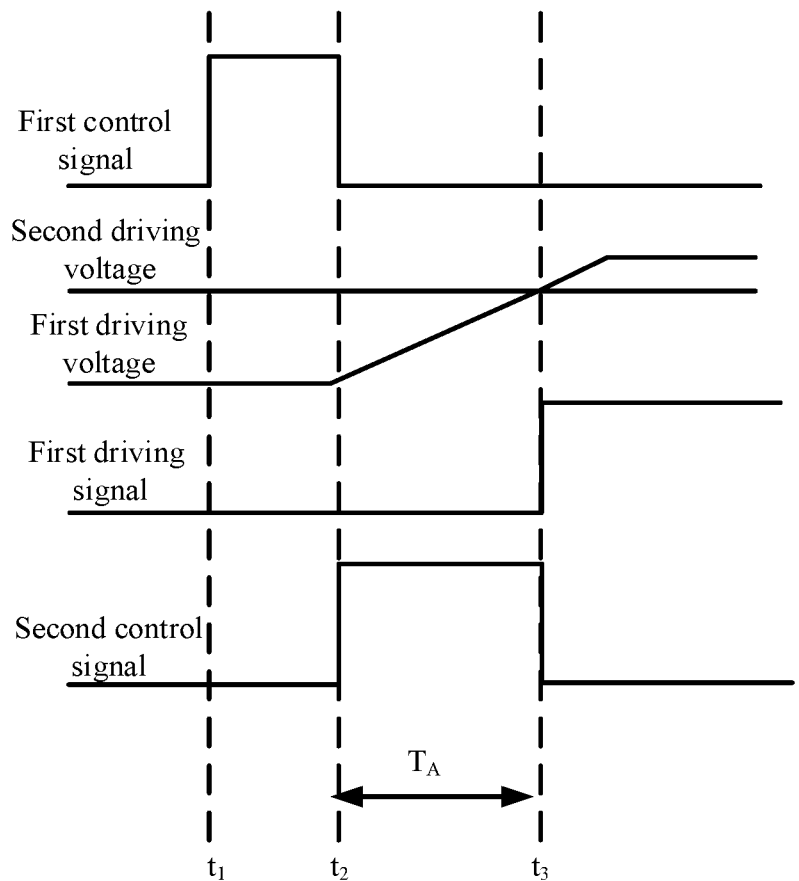
FIG. 6 is a logic timing diagram of a dynamic amplification circuit according to an embodiment of the present disclosure.

It can be seen from the timing diagram shown in FIG. 6 that, when $V_1<V_2$, the first driving signal outputs a low level, and at a time $t_3$ after the time $t_2$, the first driving voltage is equal to the second driving voltage, that is, $V_1=V_2$. In this case, the first driving signal output by the second drive circuit is inverted from the low level to a high level.

Therefore, a duration $T_A$ of the second time period between the time $t_2$ and the time $t_3$ is a time required for the voltage value of the third capacitor to increase from zero to $V_2$, and the duration TA of the second time period may be determined according to formula (6):

$$T_A = V_2 * C_3 / I_1 \quad \text{formula (6)}$$

where $C_3$ is a capacitance value of the third capacitor 312, and $I_1$ is a current value of the first current source 311.

As can be seen from the above description, the second driving voltage may be a multiple of the reference voltage, that is, $V_2=aV_{BG}$, $I_1=V_{BG}/R_3$, which are substituted into the formula (6) to obtain:

$$T_A = \frac{aV_{BG} * C_3}{V_{BG}/R_3} = a * C_3 * R_3 \quad \text{formula (7)}$$

Further, an amplification coefficient Av of a dynamic amplification circuit may be obtained by substituting the formula (7) into the formula (5):

$$A_V = \frac{a * C_3 * R_3}{C_1 * R_1} \quad \text{formula (8)}$$

As described above, a first resistor and a third resistor may be resistors of a same type, and the first capacitor and the third capacitor are capacitors of a same type. Then, when PVT changes, the first capacitor and the third capacitor, and the first resistor and the third resistor have a same rate of change, respectively, that is, $C_3/C_1$ is a constant value, $R_3/R_1$ is a constant value, and a coefficient a may be controlled by a designer, which does not vary with PVT. Therefore, the amplification coefficient $A_v$ shown in the formula (8) is a constant value, that is, the amplification coefficient of the dynamic amplification circuit of the embodiment of the present application is a constant gain that does not vary with PVT.

Figure 8:
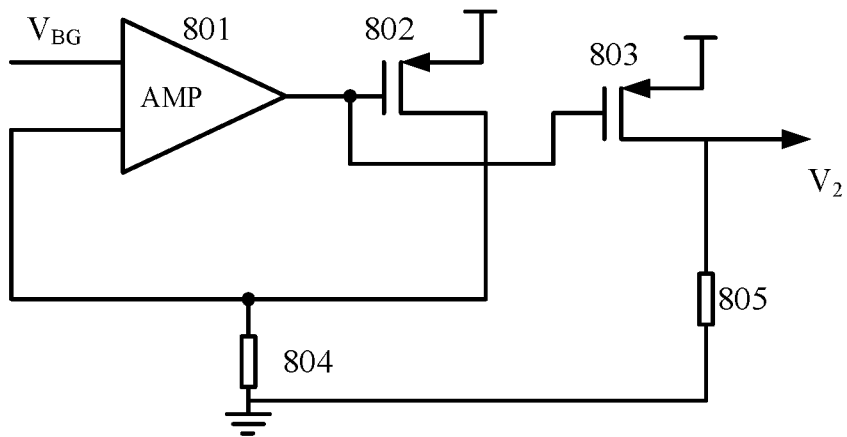
FIG. 8 is a schematic structural diagram of an example of a generation circuit of a second driving voltage.

A generation circuit of the second driving voltage will be introduced in detail below in combination with FIG. 8. It should be understood that a circuit shown in FIG. 8 is for helping those skilled in the art better understand the embodiments of the present application, rather than for limiting the scope of the embodiments of the present application. Those skilled in the art may also obtain the second driving voltage according to another circuit, which is not limited in the embodiment of the present application.

As shown in FIG. 8, the circuit may include an operational amplifier 801, a transistor 802, a transistor 803, a resistor 804 and a resistor 805.

The transistor 802 and the transistor 803 have a same W/L, where W is a gate width of the transistor and L is a gate length of the transistor.

In this embodiment, an input end of the operational amplifier 801 may receive a bandgap reference voltage $V_{BG}$, and therefore, a drain current on the transistor 802 is $V_{BG}/R_4$, where $R_4$ is a resistance value of the resistor 804. Since driving voltages at the transistors 803 and 802 are the same, a drain current of the transistor 803 is the same as a drain current of the transistor 802. Therefore, a voltage drop across the resistor 805 is $V_{BG}*R_5/R_4$, where $R_5$ is a resistance value of the resistor 805, and the voltage drop across the resistor 805 may be used as the above-mentioned second driving voltage, that is, $V_2=R_5/R_4*V_{BG}$, where $R_5/R_4$ may correspond to the foregoing a, and the value of a may be controlled through resistance values of the resistor 804 and the resistor 805.

Similar to the previous embodiment, the resistor 804 and the resistor 805 may be resistors of a same type, so that when PVT changes, it may be ensured that $R_5/R_4$ is a constant value, that is, a is a constant value.

Figure 9:
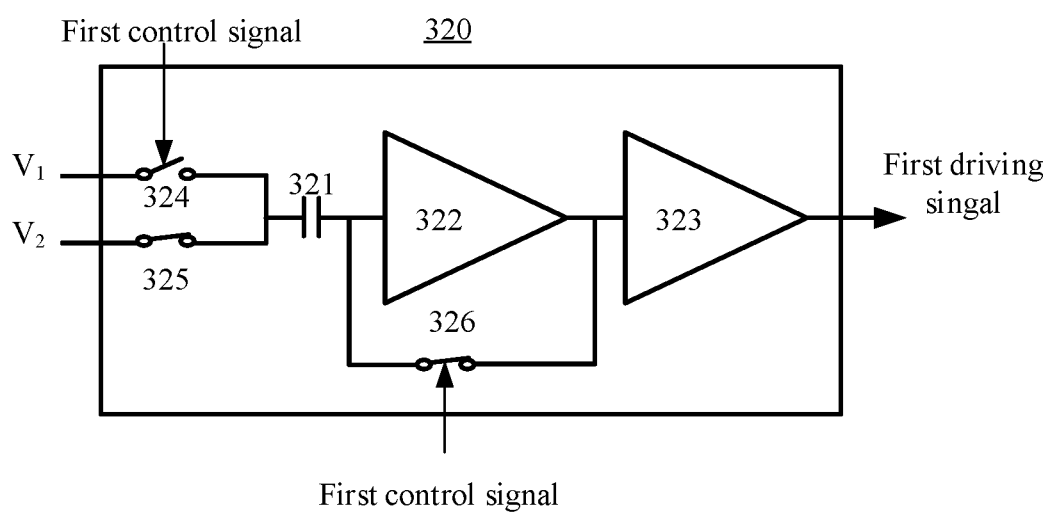
FIG. 9 is a schematic structural diagram of an example of a second drive circuit according to an embodiment of the present disclosure.

FIG. 9 is a schematic structural diagram of an example of a second drive circuit according to an embodiment of the present application. FIG. 9 shows a possible implementation manner or a preferred implementation manner of the second drive circuit; however, the embodiment of the present application is not limited to this implementation manner, and various equivalent amendment or variations according to this implementation manner fall in the scope of the embodiment of the present application.

As shown in FIG. 9, a second drive circuit 320 includes a fourth capacitor 321, a first inverter 322 and a second inverter 323.

One end of the fourth capacitor 321 receives a first driving voltage via a first switch device 324 and receives a second driving voltage via a second switch device 325, and the other end of the fourth capacitor 321 is connected to an input end of the first inverter 322.

The input end and an output end of the first inverter 322 are connected via a third switch device 326, the output end of the first inverter 322 is connected to an input end of the second inverter 323, and an output end of the second inverter 323 is used to output a first driving signal.

In the embodiment, the first control signal is used to:
control, in a first time period, a first switch device to be turned off and a second switch device and a third switch device to be turned on, and control, in a second time period and a third time period, the first switch device to be turned on and the second switch device and the third switch device to be turned off.

In this way, in the first time period between $t_1$ and $t_2$, the first switch device 324 is turned off, the second switch device 325 is turned on, and the third switch device 326 is turned on. A voltage at one end of the fourth capacitor 321 is the second driving voltage $V_2$, a voltage at the other end is a threshold voltage $V_{TH}$ of the first inverter 322, and a voltage drop across the fourth capacitor 321 is $V_{TH}$–V2.

As described above, in the first time period, whether the first driving signal outputs a low level or a high level is not concerned, as long as in the first time period, the first control signal is at a high level, and the second control signal output by the third drive circuit is at a low level.

In a second period between time $t_2$ and time $t_3$, the first switch device 324 is turned on, the second switch device 325 is turned off, and the third switch device 326 is turned off, and a voltage at one end of the fourth capacitor 321 is a first driving voltage $V_1$. Based on the principle of conservation of charge, a voltage drop across the fourth capacitor 321 is constant, then a voltage at the input end of the first inverter is $V_1+V_{TH}$–V2. Due to V1<V2 in the second time period, $V_1+V_{TH}-V_2<V_{TH}$ is satisfied, a high level is output from the first inverter, and then the first driving signal from the second inverter outputs a low level.

In a third period of time after the time $t_3$, due to $V_1 \geq V_2$, $V_1+V_{TH}-V_2 \geq V_{TH}$ is satisfied, a low level is output from the first inverter, and then the first driving signal from the second inverter outputs a high level.

Optionally, the embodiment of the present application may further adopt another equivalent circuit to implement a function of the second drive circuit, that is, a low level is output when a first driving voltage is less than a second driving voltage; and a high level is output when the first driving voltage is greater than or equal to the second driving voltage.

Optionally, in the embodiment of the present application, since the first control signal may be used to control turnon and turnoff of the first switch device, the second drive circuit further includes an input end of the first control signal, where the input end is used to input the first control signal, thereby controlling turnon and turnoff of the first switch device, the second switch device and the third switch device through the first control signal.

It should be understood that, in the embodiment of the present application, the first control signal is used to control turnon and turnoff of the first switch device, the second switch device, the third switch device, and the first control switch, and the second control signal is used to control turnon and turnoff of the second control switch. These only represent that control signals have a function of controlling respective corresponding switch devices, instead of representing that there must be a direct connection relationship between input ends of these control signals and respective corresponding switch devices. It has only to be ensured that input control signals may control turnon and turnoff of corresponding switch devices.

Figure 10:
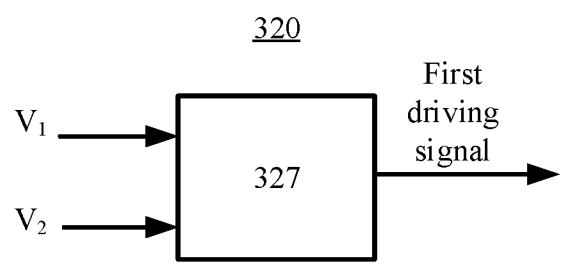
FIG. 10 is a schematic structural diagram of another example of a second drive circuit according to an embodiment of the present disclosure.

FIG. 10 is a schematic structural diagram of another example of a second drive circuit according to an embodiment of the present application. As shown in FIG. 10, a second drive circuit 320 is a continuous time comparator 327. A first input end of the continuous time comparator 327 is used to receive a first driving voltage $V_1$, a second input end of the continuous time comparator is used to receive a second voltage signal $V_2$, and an output end of the continuous time comparator 327 is used to output a first driving signal.

Specifically, in a first time period and a second time period, V1<V2, the continuous time comparator 327 outputs a low level.

In a third time period, V1≥V2, an output voltage of the continuous time comparator 327 is inverted from the low level to a high level.

Therefore, both a continuous time comparator shown in FIG. 10 and a combination circuit shown in FIG. 9 may implement a function of a second drive circuit, that is, a low level is output when a first driving voltage is less than a second driving voltage, and a high level is output when the first driving voltage is greater than or equal to the second driving voltage. In comparison with the continuous time comparator shown in FIG. 10, the combination circuit shown in FIG. 9 does not have to perform continuous comparisons, and thus power consumption is relatively low.

Figure 11:
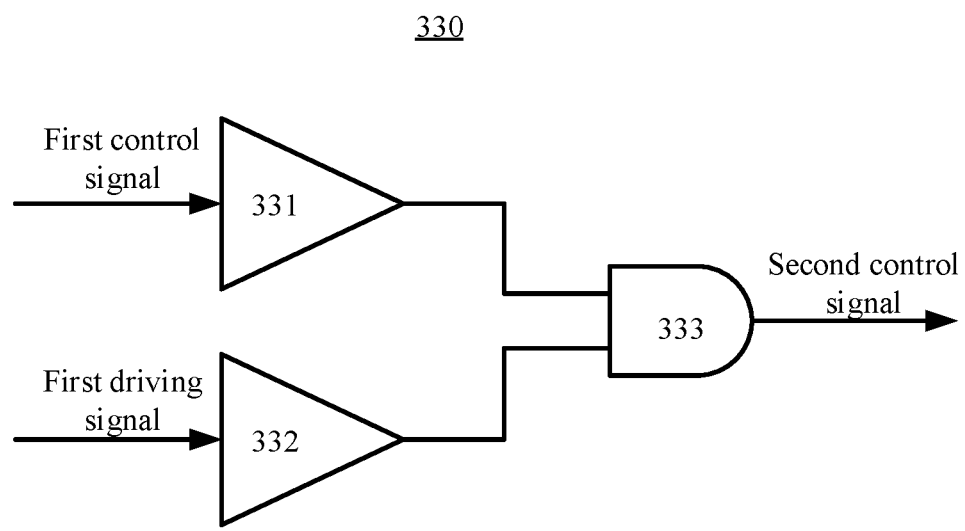
FIG. 11 is a schematic structural diagram of an example of a third drive circuit according to an embodiment of the present disclosure.

FIG. 11 is a schematic structural diagram of an example of a third drive circuit according to an embodiment of the present disclosure. As shown in FIG. 11, a third drive circuit 330 includes a third inverter 331, a fourth inverter 332 and an AND circuit 333.

An input end of the third inverter 331 is used to receive a first control signal, and an output end of the third inverter 331 is connected to a first input end of the AND circuit 333.

An input end of the fourth inverter 332 is used to receive a first driving signal, and an output end of the fourth inverter 332 is connected to a second input end of the AND circuit 333.

An output end of the AND circuit 333 is used to output a second control signal.

Therefore, the third drive circuit shown in FIG. 11 may control that the second control signal outputs a high level only when the first control signal and the first driving signal are at a low level, and the second control signal outputs a low level when the first control signal and the first driving signal are in another operating state.

Optionally, the AND circuit 333 may be implemented with an AND gate or another equivalent circuit.

Therefore, a dynamic amplification circuit of an embodiment of the present application controls a voltage value output by a first driving voltage through a first control signal, and then according to the first driving voltage and the second driving voltage, controls a duration of a second time period to be proportional to a product of a resistance value of a resistor and a capacitance value of a capacitor in a DA, so that the dynamic amplification circuit could still provide relatively stable gain when PVT changes.

It should be understood that, first, second, third, fourth and various numerical numbers (for example, a first drive circuit 310, a second drive circuit 310 and the like) involved in the text are merely for convenience of description, and are not intended to limit the protection scope of embodiments of the present application.

A cathode of a power supply in the foregoing embodiments may be set as a ground potential (i.e., grounding), or may be another potential in a specific implementation of course, such as a negative potential, which is not limited by the embodiments of the present application.

Described above are specific embodiments of the present application only, but the protection scope of the present application is not limited thereto, those skilled who are familiar with the art could readily think of variations or substitutions within the technical scope disclosed by the present application, and these variations or substitutions shall fall within the protection scope of the present application. Therefore, the protection scope of claims should prevail over the protection scope of the present application.

What is claimed is:

1. A dynamic amplification circuit, comprising:
a first drive circuit, configured to generate a first driving voltage according to a first control signal and a first driving current, wherein the first driving current is generated by a first reference voltage, and the first reference voltage is a constant voltage;
a second drive circuit, configured to generate a first driving signal according to the first driving voltage and a second driving voltage, wherein the first driving voltage varies with time, and the second driving voltage is a multiple of the first reference voltage;
a third drive circuit, configured to generate a second control signal according to the first control signal and the first driving signal; and
a dynamic amplifier DA comprising a first branch and a second branch, wherein the first branch comprises a first capacitor, the second branch comprises a second capacitor, the first capacitor and the second capacitor are identical capacitors, the first branch and the second branch are connected through a first resistor and a second resistor, and the first resistor and the second resistor are identical resistors,
wherein the DA is configured to receive the first control signal and the second control signal, and an operation state of the DA is controlled through the first control signal and the second control signal, wherein a duration of the DA in an amplification phase is proportional to a product of a resistance value of the first resistor and a capacitance value of the first capacitor.

2. The dynamic amplification circuit according to claim 1, wherein the first branch further comprises a first control switch and a second control switch; and
the DA is configured to:
receive the first control signal and the second control signal, and control turnon and turnoff of the first control switch and the second control switch through the first control signal and the second control signal respectively.

3. The dynamic amplification circuit according to claim 2, wherein an operation state of the first control signal comprises:
in a first time period, the first control signal outputs a high level;
in a second time period after the first time period, the first control signal outputs a low level, and a duration of the second time period is the duration of the DA in an amplification phase; and
in a third time period after the second time period, the first control signal outputs a low level.

4. The dynamic amplification circuit according to claim 3, wherein the first drive circuit is configured to:
in the first time period, control the first driving voltage to be zero;
in the second time period, control the first driving voltage to start to increase, but to be smaller than the second driving voltage; and
in the third time period, control the first driving voltage output to be greater than or equal to the second driving voltage.

5. The dynamic amplification circuit according to claim 4, wherein the first drive circuit comprises a first current source and a third capacitor; and
the first current source is configured to: charge the third capacitor in the second time period and the third time period, wherein a voltage drop of the third capacitor is the first driving voltage, a current value of the first current source is equal to the first driving current, and the first driving current is generated by applying the first reference voltage on a third resistor.

6. The dynamic amplification circuit according to claim 5, wherein an amplification factor of the dynamic amplification circuit is proportional to $R_3 * C_3 / (R_1 * C_1)$, wherein $R_3$ is a resistance value of the third resistor, $C_3$ is a capacitance value of the third capacitor, $R_1$ is a resistance value of the first resistor, and $C_1$ is a capacitance value of the first capacitor.

7. The dynamic amplification circuit according to claim 6, wherein the second resistor and the third resistor are resistors of a same type, and the second capacitor and the third capacitor are capacitors of a same type.

8. The dynamic amplification circuit according to claim 3, wherein the second drive circuit is configured to:
in the second time period, control the first driving signal output to be a low level; and
in a third time period, control the first driving signal output to be a high level.

9. The dynamic amplification circuit according to claim 8, wherein the second drive circuit comprises a fourth capacitor, a first inverter and a second inverter,
wherein one end of the fourth capacitor receives the first driving voltage via a first switch device and receives the second driving voltage via a second switch device, and the other end of the fourth capacitor is connected to an input end of the first inverter; and
the input end and an output end of the first inverter are connected via a third switch device, the output end of the first inverter is connected to an input end of the second inverter, and an output end of the second inverter is configured to output the first driving signal.

10. The dynamic amplification circuit according to claim 9, wherein the first control signal is further used to:
control turnon and turnoff of the first switch device, the second switch device and the third switch device,
wherein the first control signal is used to:
control, in the first time period, the first switch device to be turned off and the second switch device and the third switch device to be turned on, and control, in the second time period and the third time period, the first switch device to be turned on and the second switch device and the third switch device to be turned off.

11. The dynamic amplification circuit according to claim 8, wherein the second drive circuit is a continuous time comparator, a first input end of the continuous time comparator is used to receive the first driving voltage, a second input end of the continuous time comparator is used to receive the second driving voltage, and an output end of the continuous time comparator is used to output the first driving signal.

12. The dynamic amplification circuit according to claim 3, wherein the third drive circuit is configured to:
in the first time period, control the second control signal output to be a low level;
in the second time period, control the second control signal output to be a high level; and
in a third time period, control the second control signal output to be a low level.

13. The dynamic amplification circuit according to claim 12, wherein the third drive circuit comprises a third inverter, a fourth inverter and an AND circuit, wherein an input end of the third inverter is used to receive the first control signal, and an output end of the third inverter is connected to a first input end of the AND circuit;

an input end of the fourth inverter is used to receive the first driving signal, and an output end of the fourth inverter is connected to a second input end of the AND circuit; and an output end of the AND circuit is used to output the second control signal.

14. The dynamic amplification circuit according to claim 3, wherein the first control signal is used to:

control, in the first time period, the first control switch to be turned on, and control, in the second time period and the third time period, the first control switch to be turned off; and the second control signal is used to:

control, in the first time period, the second control switch to be turned off, control, in the second time period, the second control switch to be turned on, and control, in the third time period, the second control switch to be turned off.

15. The dynamic amplification circuit according to claim 1, wherein the first reference voltage is a bandgap reference voltage.

16. The dynamic amplification circuit according to claim 1, wherein the first branch further comprises a first transistor, the second branch further comprises a second transistor, and a source of the first transistor and a source of the second transistor are connected through the first resistor and the second resistor.

17. The dynamic amplification circuit according to claim 16, wherein a product of a transconductance of the first transistor in a saturation region and a resistance value of the first resistor is greater than a multiple threshold.

* * * * *